United States Patent
Seo et al.

(10) Patent No.: US 7,759,198 B2
(45) Date of Patent: Jul. 20, 2010

(54) METHOD OF FORMING SEMICONDUCTOR DEVICES HAVING A VERTICAL CHANNEL TRANSISTOR

(75) Inventors: Hyeoung-won Seo, Gyeonggi-do (KR); Jae-man Yoon, Seoul (KR); Dong-gun Park, Gyeonggi-do (KR); Seong-goo Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 685 days.

(21) Appl. No.: 11/638,797

(22) Filed: Dec. 14, 2006

(65) Prior Publication Data

US 2007/0190766 A1  Aug. 16, 2007

(30) Foreign Application Priority Data

Feb. 13, 2006  (KR) .................... 10-2006-0013711

(51) Int. Cl.
*H01L 21/336* (2006.01)

(52) U.S. Cl. .................. 438/268; 438/253; 438/270; 257/E21.41

(58) Field of Classification Search ............. 438/585, 438/268, 270, 272, 253; 257/E21.41
See application file for complete search history.

(56) References Cited

U.S. PATENT DOCUMENTS

| 5,817,552 | A | 10/1998 | Roesner et al. | 438/241 |
| 6,746,918 | B2 * | 6/2004 | Wu | 438/257 |
| 6,881,994 | B2 * | 4/2005 | Lee et al. | 257/296 |
| 7,242,057 | B2 * | 7/2007 | Tang et al. | 257/330 |
| 2005/0164454 | A1 | 7/2005 | Leslie | 438/269 |
| 2006/0097304 | A1 * | 5/2006 | Yoon et al. | 257/307 |

FOREIGN PATENT DOCUMENTS

JP   08064778   3/1996

* cited by examiner

*Primary Examiner*—Michael Trinh
(74) *Attorney, Agent, or Firm*—Myers Bigel Sibley & Sajovec, P.A.

(57) ABSTRACT

Methods of manufacturing a semiconductor device include forming a matrix of active pillars including a channel part on a substrate. Channel dopant regions are formed in the channel parts of the active pillars. Gate electrodes are formed on an outer surface of the channel parts that surround the channel dopant regions. The matrix of active pillars may be arranged in rows in a first direction and in columns in a second direction crossing the first direction on the substrate.

23 Claims, 21 Drawing Sheets

METHOD OF FORMING SEMICONDUCTOR DEVICES HAVING A VERTICAL CHANNEL TRANSISTOR

CROSS-REFERENCE TO RELATED PATENT APPLICATION

This application is related to and claims priority under 35 U.S.C. §119 from Korean Patent Application No. 10-2006-0013711, filed on Feb. 13, 2006 in the Korean Intellectual Property Office, the disclosure of which is incorporated herein by reference in its entirety.

BACKGROUND OF THE INVENTION

The present invention relates to semiconductor devices, and more particularly, to semiconductor devices having a vertical channel transistor and methods of manufacturing the same.

In an integrated circuit (semiconductor) device that employs a planar type transistor, in which a gate electrode is formed on an integrated circuit (semiconductor) substrate and junction regions are formed on both sides of the gate electrode, as the integration density of the semiconductor device increases, a channel length of the transistor generally is reduced and various attempts have been made to accommodate the need for a reduced channel length. However, as the length of the channel is reduced, short channel effects, such as drain induced barrier lowering (DIBL), hot carrier effect, and/or punch through may be more likely to occur. To limit or even prevent the short channel effects, various methods have been proposed. Examples of such proposed methods include a method that reduces the depth of junction regions and a method that relatively increases the channel length by forming a groove in a channel portion. However, as the integration density of semiconductor memory devices, and in particular, dynamic random access memories (DRAM), reaches the giga bit scale, it becomes more difficult to prevent short channel effects.

To address this problem, transistors having a vertical channel have also been proposed. A DRAM cell having a vertical channel transistor and a method of manufacturing the DRAM cell are described, for example, in U.S. Pat. No. 5,817,552 ("the '552 patent"). In this method, a semiconductor substrate that includes a first layer doped with a first conductive type, a second layer doped with a second conductive type that is opposite to the first conductive type, and a third layer doped with the first conductive type is provided. Afterward, a first trench that passes through the third layer, the second layer, and the first layer is formed in the semiconductor substrate, and a second trench that crosses the first trench and passes through the third layer and the second layer is formed in the semiconductor substrate. A gate oxide film that covers at least an exposed surface of the second layer is formed, and a gate electrode that surrounds the second layer is formed on the gate oxide film. Afterward, a storage capacitor that is electrically connected to the third layer is formed on the third layer. The first through third layers are epitaxially grown on a single crystal silicon substrate and doped with predetermined dopants. The first and third layers correspond to first and second source/drain regions, respectively, and the second layer corresponds to a channel region.

As described above, in the '552 patent, the first layer corresponding to the first source/drain region, the second layer corresponding to the channel region, and the third layer corresponding to the second source/drain region are epitaxially grown on a single crystal silicon substrate. Afterward, an active pillar is formed by forming trenches and a gate electrode that surrounds the channel region is formed. As a result, the channel region in the '552 patent is defined prior to forming the active pillar. As a result, it may be difficult to locate the channel region in a specific region when the active pillar is formed. Accordingly, it may be difficult to correctly align the channel region and the gate electrode.

SUMMARY OF THE INVENTION

Some embodiments of the present invention provide methods of manufacturing a semiconductor device including forming a matrix of active pillars including a channel part on a substrate. Channel dopant regions are formed in the channel parts of the active pillars. Gate electrodes are formed on an outer surface of the channel parts that surround the channel dopant regions. The matrix of active pillars may be arranged in rows in a first direction and in columns in a second direction crossing the first direction on the substrate.

In further embodiments of the present invention, forming the channel dopant regions is preceded by doping an exposed region of the substrate between the active pillars with a bit line dopant and forming device isolation trenches in the substrate region doped with the bit line dopant to define buried bit lines that extend along the respective columns of the active pillars. Forming the channel dopant regions may be preceded by isotropically etching the channel parts and the channel dopant regions may be formed using a plasma doping process.

In other embodiments, forming the gate electrodes includes forming the gate electrodes extending along the respective rows of the active pillars to surround channel parts disposed in the respective rows of the active pillars. Forming the channel dopant regions may be preceded by forming an insulating film having grooves that expose the respective rows of the active pillars on the substrate. The channel dopant regions may be selectively formed in the channel parts of the active pillars exposed in the grooves. The gate electrodes may be formed by etching back a gate conductive film after burying the gate conductive film in the grooves. Forming the matrix of active pillars may further include selectively isotropically etching the channel parts before forming the channel dopant regions.

In further embodiments, forming the channel dopant regions is preceded by defining buried bit lines that extend along the respective columns of the active pillars by doping the substrate exposed between the active pillars with a bit line dopant and forming device isolation trenches in the substrate exposed between the columns of the active pillars. An insulating film is formed that has grooves that expose the respective rows of the active pillars on the substrate. The channel dopant regions are formed in the channel parts of the active pillars in the grooves and the gate electrodes are formed by etching back a gate conductive film after burying the gate conductive film in the grooves.

In other embodiments, forming the matrix of active pillars further includes forming a source part disposed on the channel part of the active pillars. The method further includes forming source regions by doping a source dopant in the source parts after the gate electrodes are formed. Storage electrodes connected to the respective source regions may be formed. Forming the storage electrodes may be preceded by forming contact pads connected to the respective source parts. The storage electrodes may be connected to the respective contact pads.

In yet further embodiments, methods of manufacturing a semiconductor device include forming hard mask patterns arranged in a first direction and a second direction crossing the first direction on a substrate. Pillar-shaped source parts are formed arranged in rows in the first direction and columns in the second direction by etching the substrate using the hard mask patterns as masks. Spacers are formed on sidewalls of each of the source parts. Pillar-shaped channel parts are formed extending below each of the source parts by further etching the substrate using the hard mask patterns and the spacers as masks, to form active pillars. Ones of the active pillars include respective ones of the source parts and the channel parts. An exposed region of the substrate between the active pillars is doped with a bit line dopant. Device isolation trenches are formed in the substrate proximate the region doped with the bit line dopant to define buried bit lines that extend along the respective columns of the active pillars. Channel dopant regions are formed in the channel parts and gate electrodes are formed on an outer surface of the channel parts that surround the channel dopant regions.

In other embodiments, forming the channel dopant regions is preceded by selectively isotropically etching the channel parts. Forming the gate electrodes may be followed by forming source regions by doping a source dopant in the source parts and storage electrodes may be formed connected to the respective source regions. Forming the storage electrodes may be preceded by forming contact pads connected to the respective source parts and the storage electrodes may be connected to the respective contact pads.

In yet other embodiments, semiconductor devices include a substrate and a plurality of active pillars arranged in a matrix on the substrate. Each of the pillars includes a channel part that includes a channel dopant region disposed in a surface of the channel part. A gate electrode surrounds an outer surface of the channel part. The plurality of active pillars may be arranged in rows in a first direction and columns in a second direction crossing the first direction.

In other embodiments, the outer surface of the channel part is recessed. The channel dopant region may be a plasma doped region. Buried bit lines may be provided in the substrate extending along respective columns of the matrix of active pillars that surround ones of the plurality of active pillars in the respective column. The gate electrode may extend along the row of the active pillars to surround the channel parts disposed in the row of the active pillars.

In further embodiments, an insulating film on the substrate has a groove that exposes the row of the active pillars and the gate electrode is disposed in the groove. Ones of the active pillars may further include a source part disposed on the channel part. Storage electrodes may be connected to the source parts. Contact pads may be interposed between the storage electrodes and the source parts.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1A:
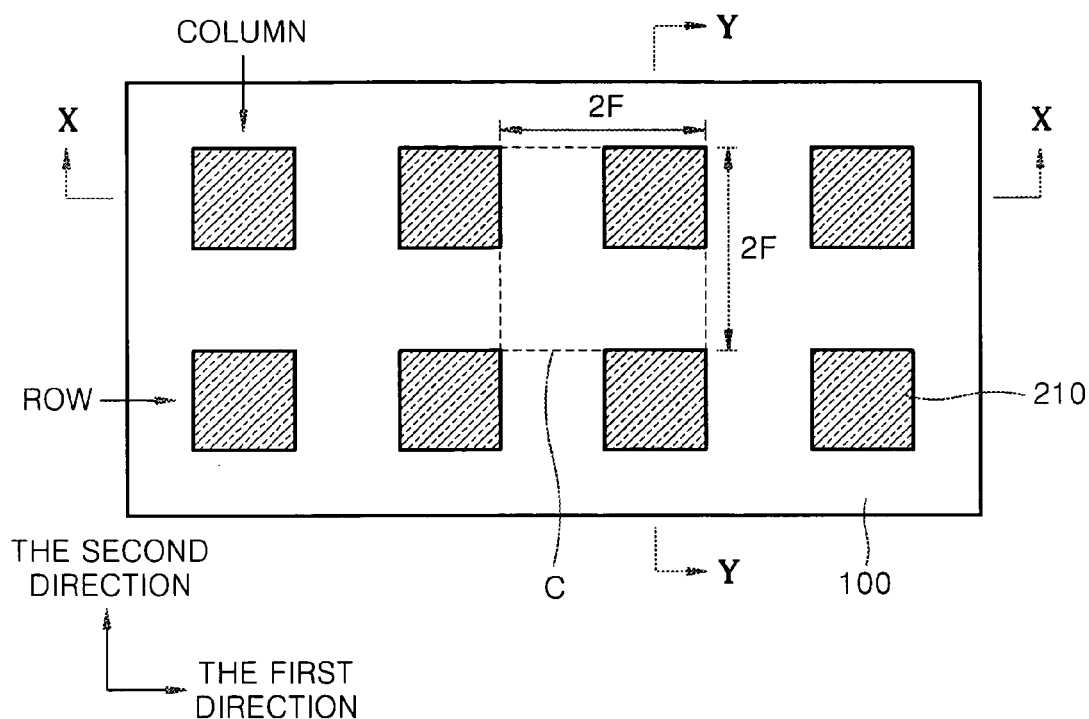
FIGS. 1A through 1F are plan views illustrating a method of manufacturing a semiconductor device according to some embodiments of the present invention.
Figure 1B:
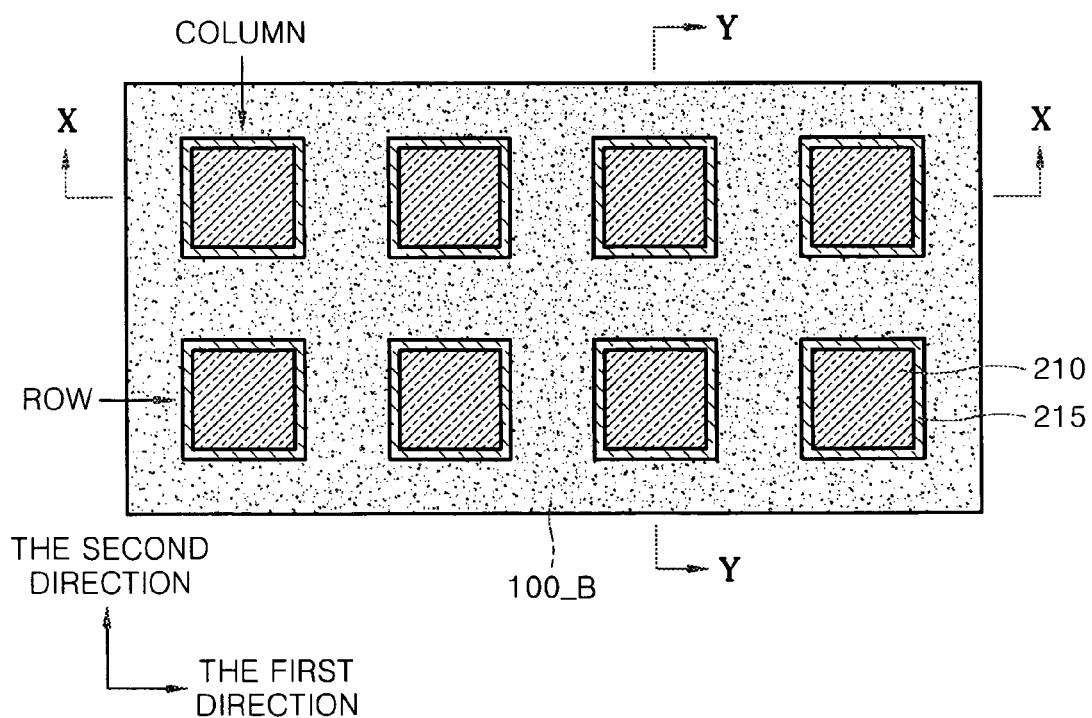

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the present specification and the relevant art and will not be interpreted in an idealized or overly formal sense unless expressly so defined herein.

Various embodiments of the present invention will now be described with reference to FIGS. 1A through 1F, 2A through 2J, 3A through 3J and 4A through 4J. FIGS. 1A through 1F are plan views illustrating a method of manufacturing a semiconductor device according to some embodiments of the present invention. FIGS. 2A through 2J are partially exploded perspective views illustrating a method of manufacturing a semiconductor device according to some embodiments of the present invention. FIGS. 3A through 3J are cross-sectional views taken along the line X-X of FIGS. 1A through 1F, respectively, according to some embodiments of the present invention. FIGS. 4A through 4J are cross-sectional views taken along the line Y-Y of FIGS. 1A through 1F, respectively, according to some embodiments of the present invention.

Referring first to FIGS. 1A, 2A, 3A, and 4A, an integrated circuit (semiconductor) substrate 100 is illustrated. The substrate 100 can be, for example, a silicon single crystal substrate and/or a silicon-on-insulator (SOI) substrate. A pad oxide film may be formed on the substrate 100. The pad oxide film may be formed using, for example, a thermal oxidation method. A hard mask film may be stacked on the pad oxide film. The hard mask film may be formed, for example, of a material having an etch selectivity with respect to the pad oxide film and the substrate 100. The hard mask film can be, for example, a silicon nitride film and/or a silicon oxynitride film. A photoresist film is formed on the hard mask film, and a photoresist pattern is formed by exposing the photoresist film.

The hard mask film and the pad oxide film are etched using the photoresist pattern as a mask. As a result, as illustrated in FIGS. 1A, 2A, 3A and 4A, hard mask patterns 210, arranged in a first direction and a second direction crossing the first direction, and pad oxide film patterns 205 under the hard mask patterns 210 are formed. The hard mask patterns 210 may be exposed by removing the photoresist pattern.

Figure 2A:
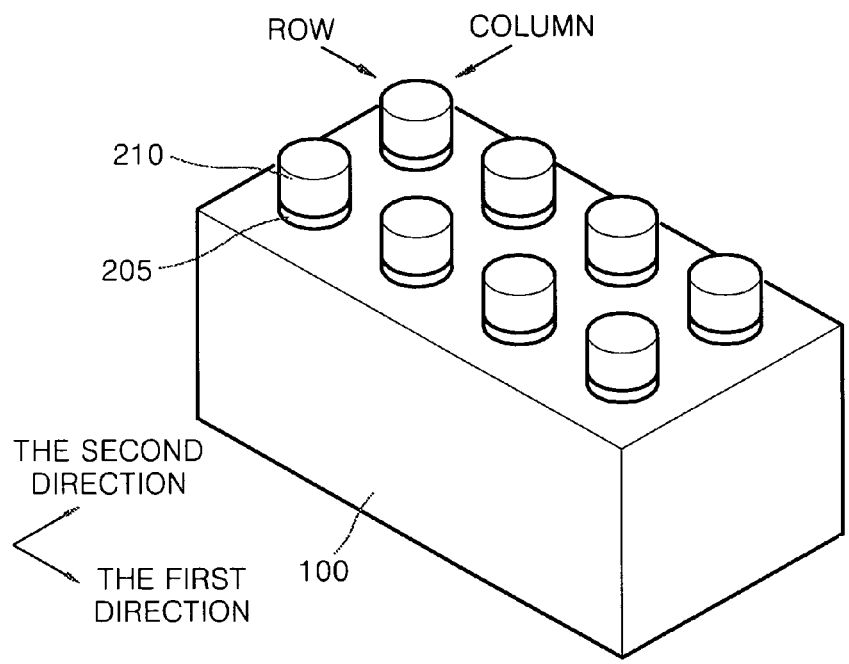
FIGS. 2A through 2J are partially exploded perspective views illustrating a method of manufacturing a semiconductor device according to some embodiments of the present invention.

A unit cell region C is shown in FIG. 1A. A first side of the unit cell region C has a length 2F (F: minimum feature size), which defines a pitch in the first direction of the hard mask pattern 210, and a second side of the unit cell region C has a length 2F, which defines a pitch in the second direction of the hard mask pattern 210. As a result, the area of the illustrated unit cell region C is $4F^2$. Note that, while the hard mask pattern 210 is illustrated as square-shaped in FIG. 1A, as a result of processes, such as exposing and wearing during etching, an upper surface of the hard mask pattern 210 can have a circular shape as depicted in FIG. 2A.

Figure 3A:
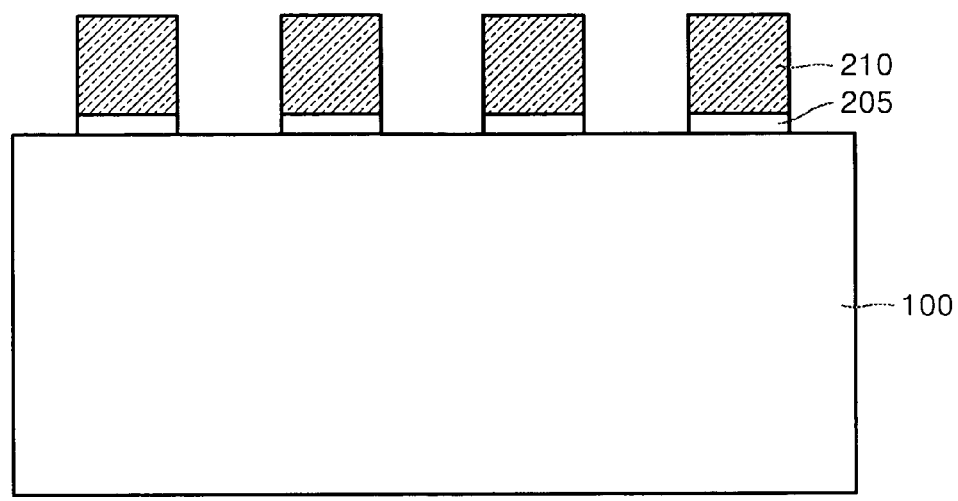
FIGS. 3A through 3J are cross-sectional views taken along the line X-X of FIGS. 1A through 1F, respectively, according to some embodiments of the present invention.
Figure 3B:
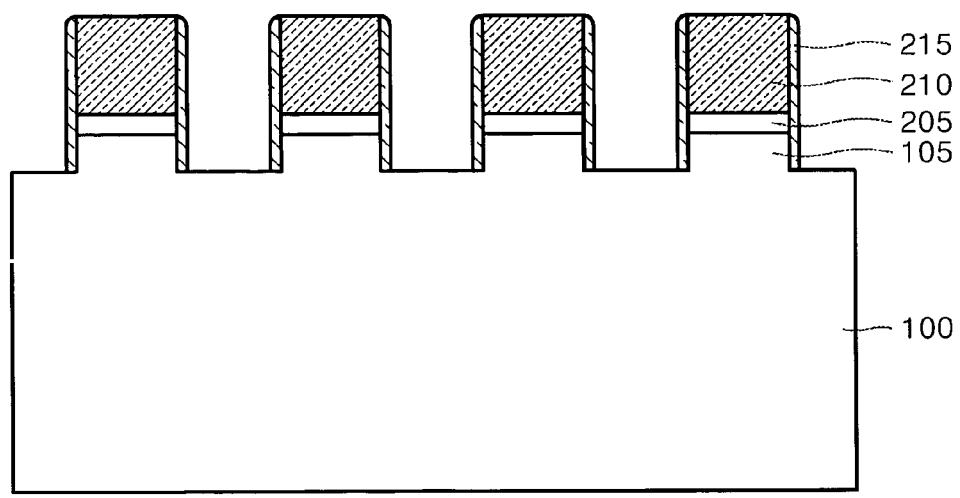
Figure 3C:
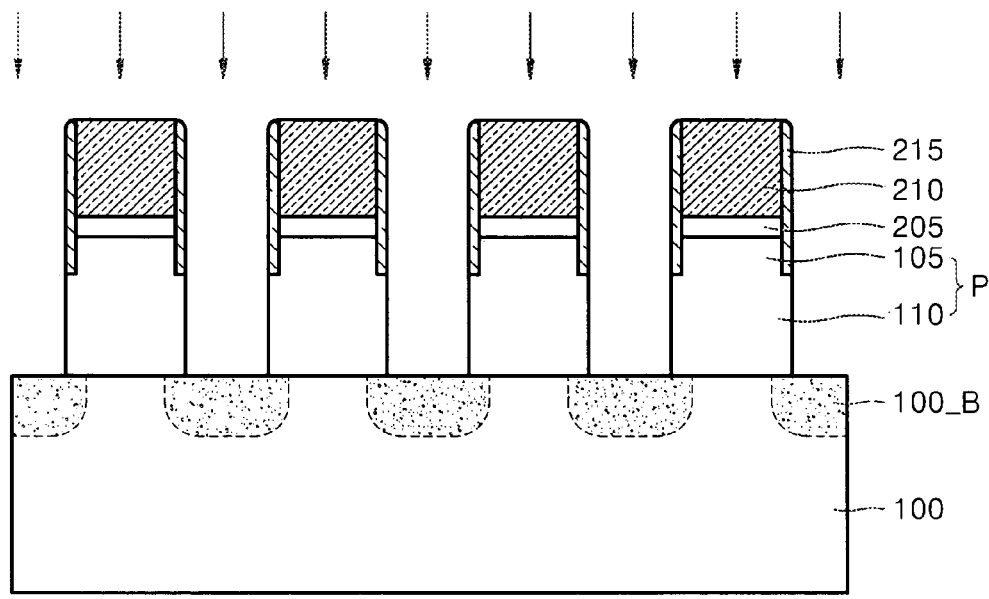
Figure 4A:
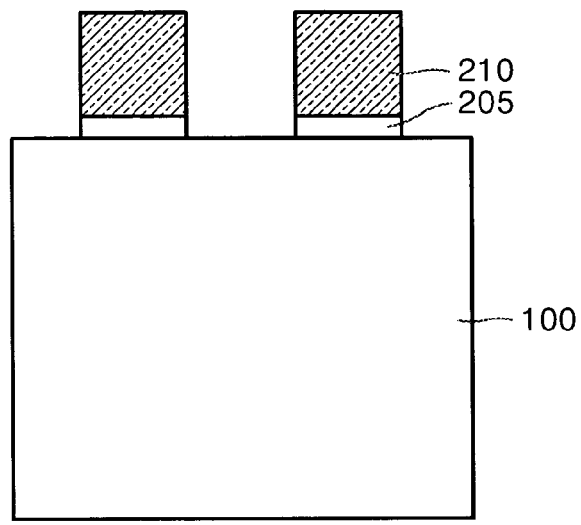
FIGS. 4A through 4J are cross-sectional views taken along the line Y-Y of FIGS. 1A through 1F, respectively, according to some embodiment of the present invention.
Figure 4B:
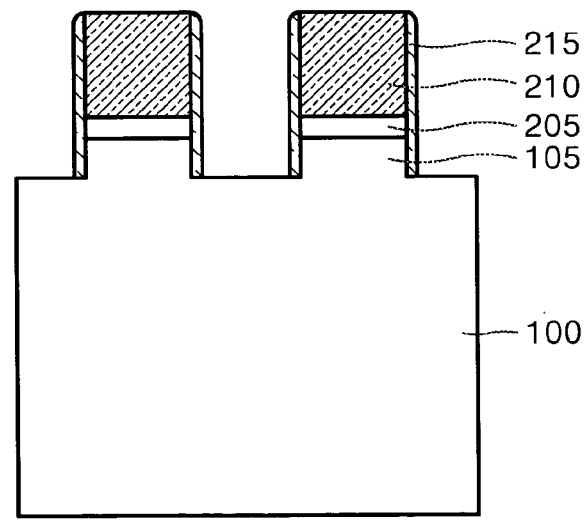
Figure 4C:
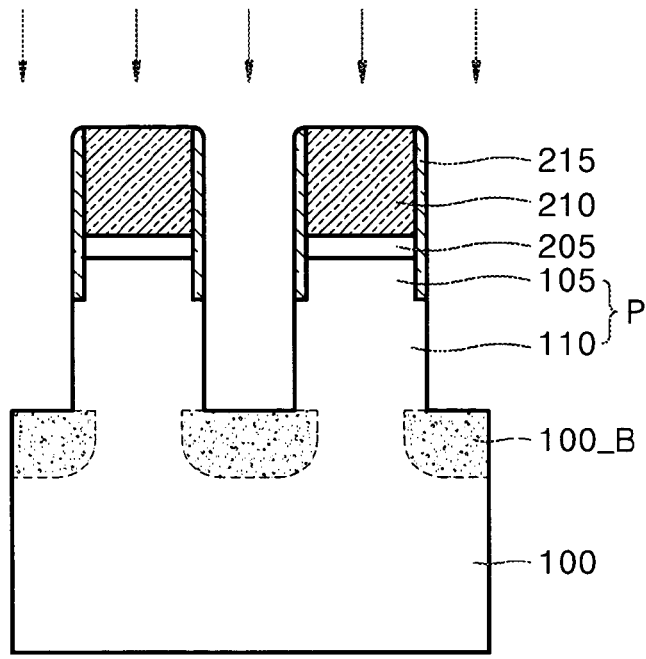
Figure 4D:
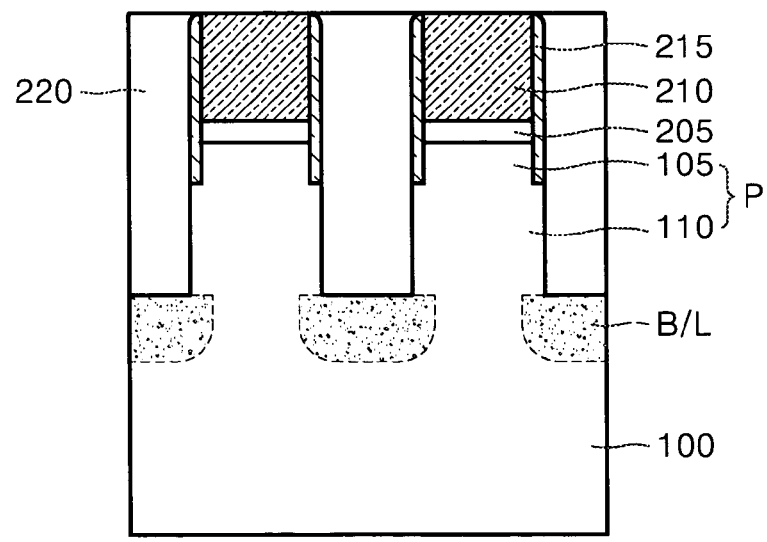

Referring now to FIGS. 3B, and 4B, pillar-shaped source parts 105 formed of the same material as the substrate 100 may be formed by etching the substrate 100 to a predetermined depth using the hard mask patterns 210 as masks. The etching can be anisotropic etching. Accordingly, the width of the source part 105 can be the same as the width of the hard mask pattern 210. The source parts 105 are shown arranged in the first and second directions. That is, the source parts 105 are formed in rows in the first direction and columns in the second direction.

Figure 2B:
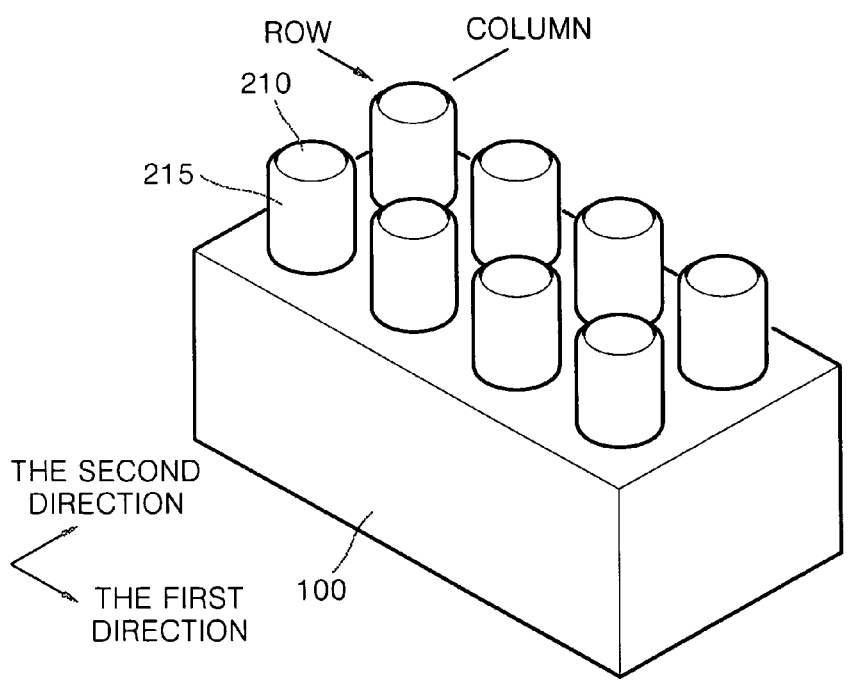
Figure 2C:
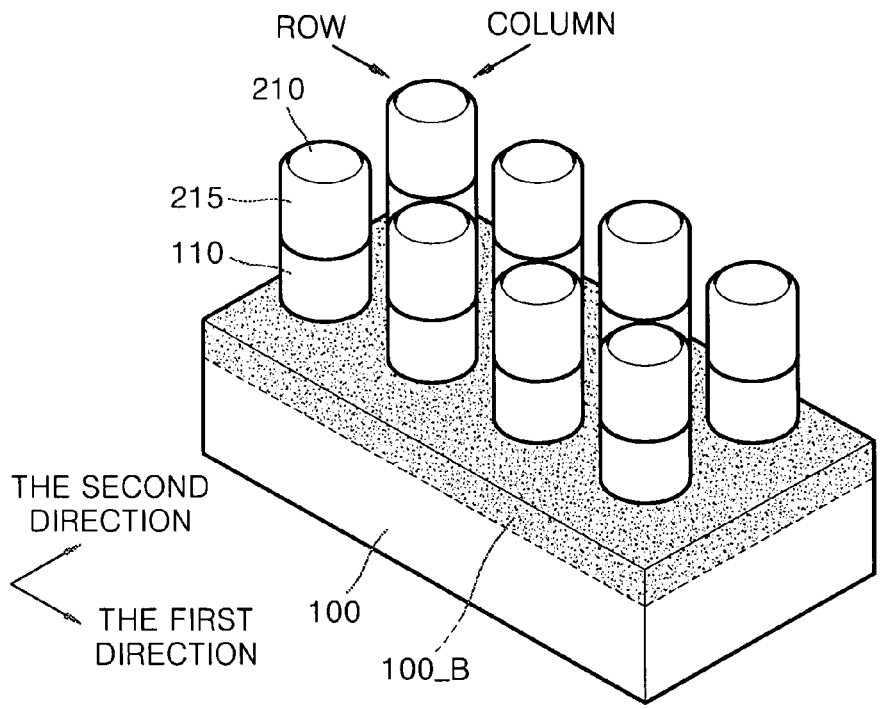

As shown in FIGS. 2B, 3B and 4B, a spacer layer may be stacked on the substrate 100 on which the source parts 105 are formed and spacers 215 may be formed on sidewalls of the source parts 105 by, for example, etching back the spacer layer. The spacers 215 can also be formed on sidewalls of the hard mask patterns 210. The spacers 215 can be formed of a material having an etch selectivity to the substrate 100, such as a silicon nitride and/or a silicon oxynitride.

Referring to FIGS. 1B, 2C, 3C, and 4C, the substrate 100 is etched to a predetermined depth using the hard mask patterns 210 and the spacers 215 as masks. The etching can be anisotropic etching. As a result, pillar-shaped channel parts 110 that extend downward integrally with the source parts 105 and are formed of the same material as the substrate 100 may be formed. The channel part 110 and the source part 105 formed on the channel part 110 define an active pillar P.

Bit line dopant regions 100_B may be formed by doping the portions of the substrate 100 between the active pillars P with a bit line dopant. The bit line dopant can be a first type dopant. More specifically, the bit line dopant can be an n-type dopant, such as P or As, and the dopant can be implanted using an ion implantation method in some embodiments. When implanting using the ion implantation method, the bit line dopant may not be doped into the channel parts 110 because the ion beams of the ion implantation method may go substantially straight forward during implantation. The bit line dopant may be doped with a dosage sufficient to reduce sheet resistance.

Figure 1C:
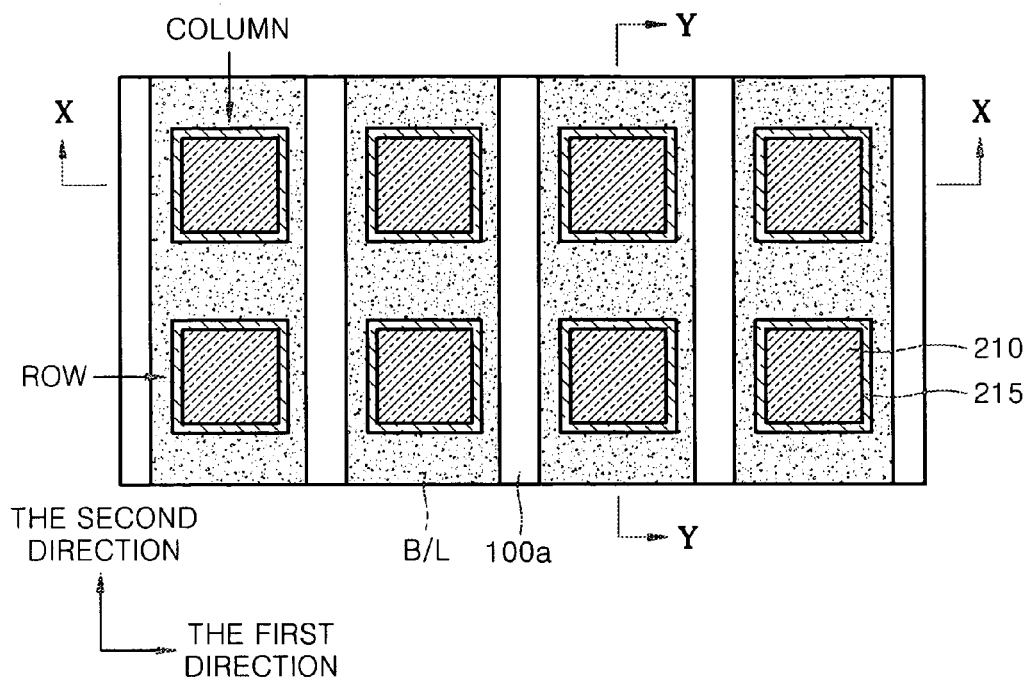
Figure 1D:
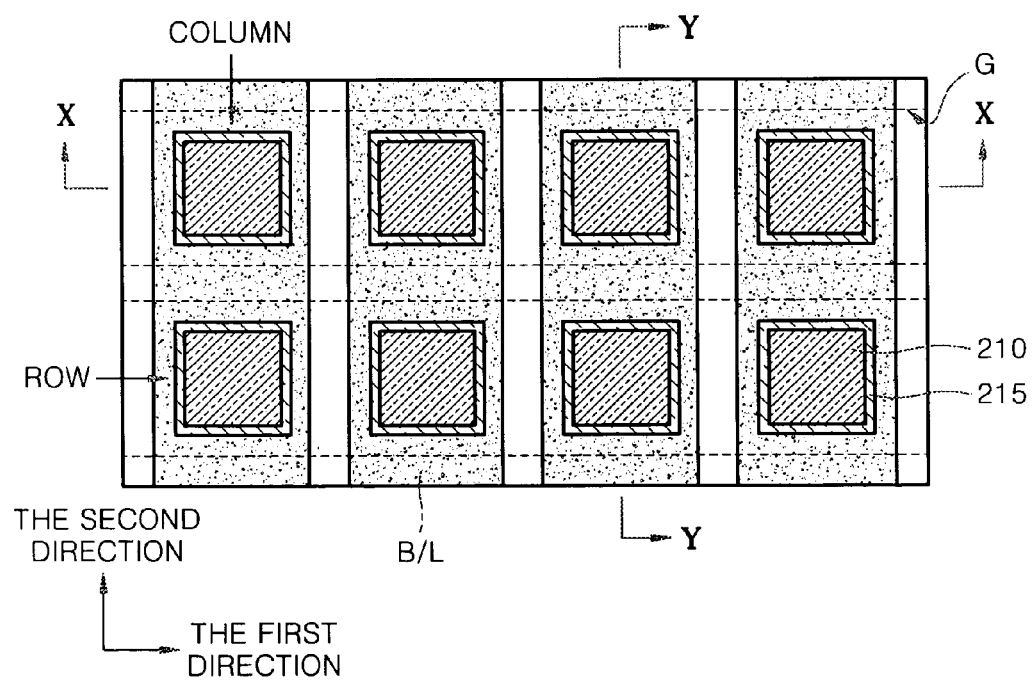
Figure 1E:
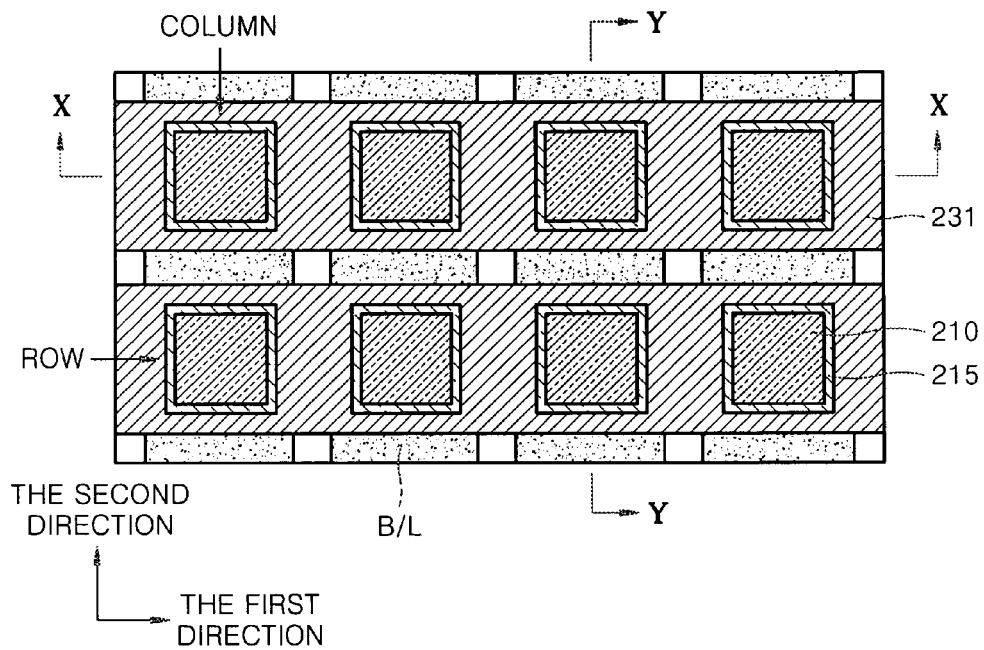
Figure 1F:
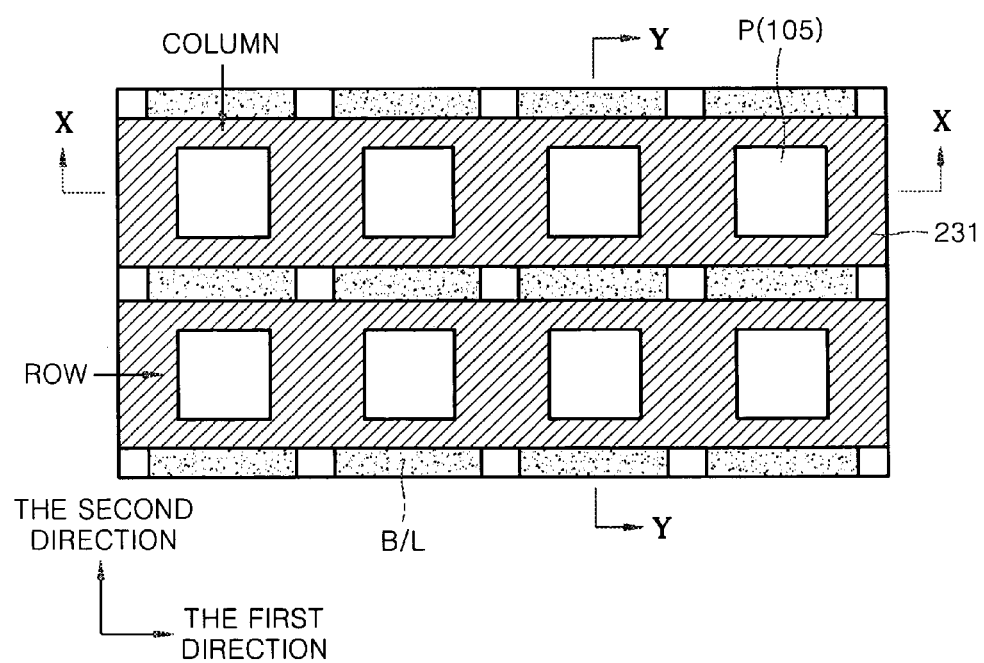
Figure 2D:
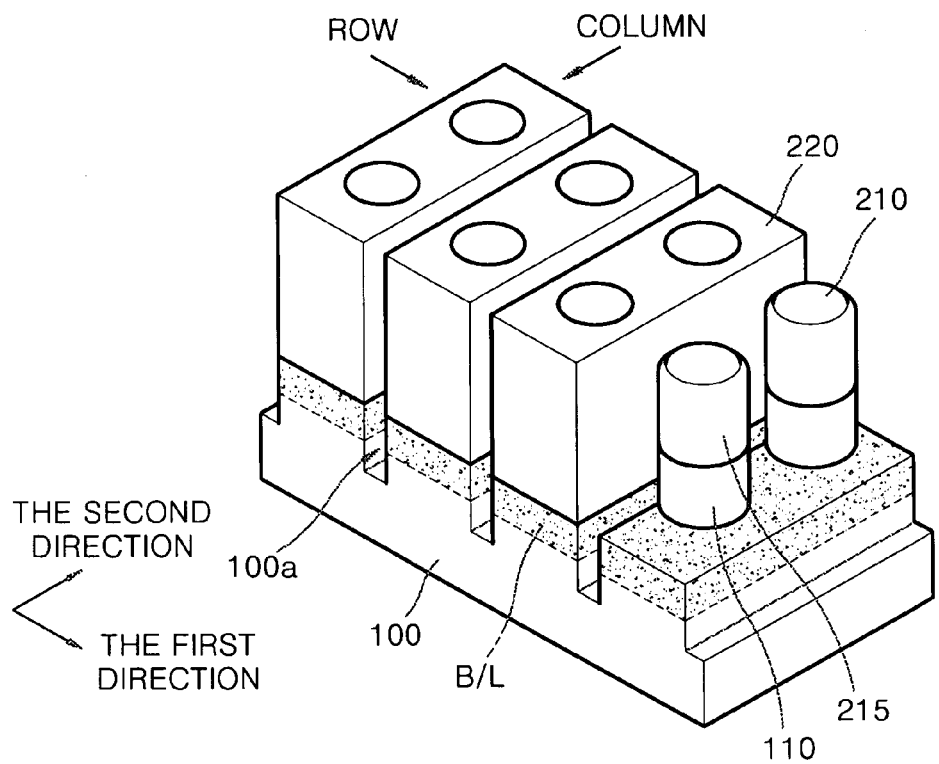
Figure 3D:
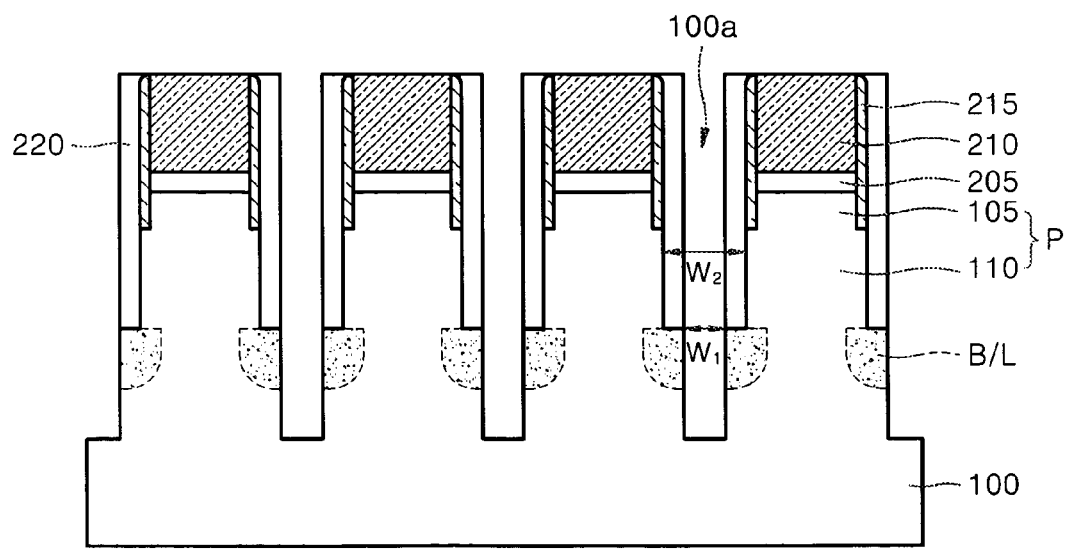

Referring next to FIGS. 1C, 2D, 3D, and 4D, a first interlayer insulating film 220 is shown deposited on the substrate 100. The first interlayer insulating film 220 can be planarized until the hard mask patterns 210 are exposed. A photoresist pattern may be formed on the first interlayer insulating film 220. The substrate 100 may be exposed by etching the first interlayer insulating film 220 using the photoresist pattern as a mask, and the exposed substrate 100 may be etched to a predetermined depth. As a result, device isolation trenches 100a extending in the second direction may be formed in the substrate 100 between the columns of the active pillars P as shown in FIGS. 1C, 2D and 3D. The illustrated device isolation trenches 100a pass through the bit line dopant regions 100_B (see FIGS. 1B, 2C, 3C, and 4C). As a result, buried bit lines B/L that surround each of the active pillars P and extend along each of the columns of the active pillars P may be defined. At this time, a width $W_1$ of the device isolation trenches 100a may be equal to or less than a gap $W_2$ of the active pillars P in the first direction (see FIG. 3D). The buried bit lines B/L can be a drain region of a transistor.

Figure 2E:
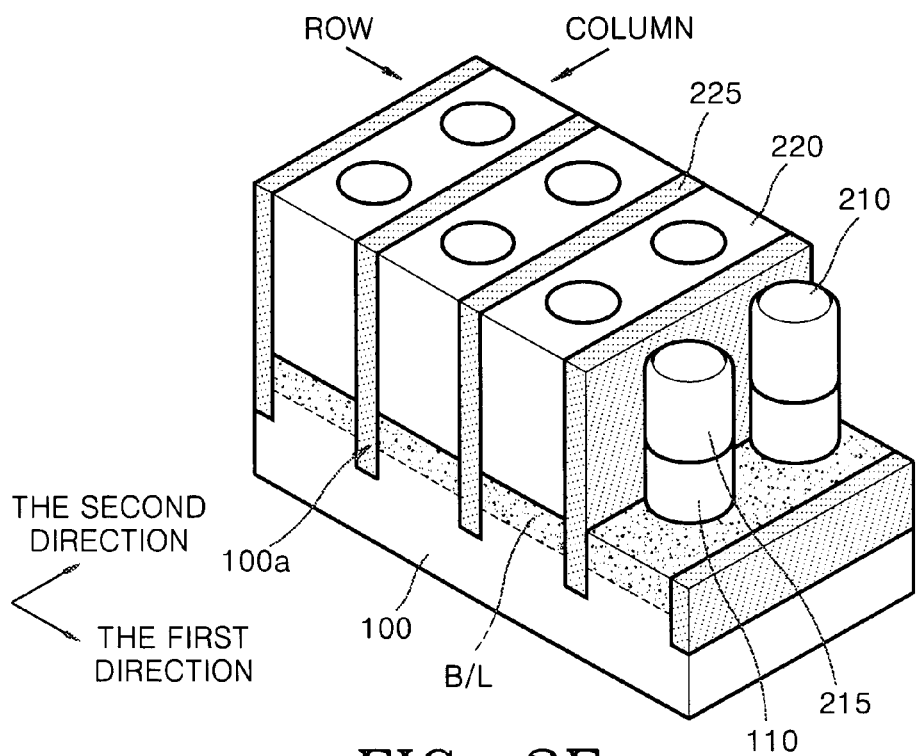
Figure 2F:
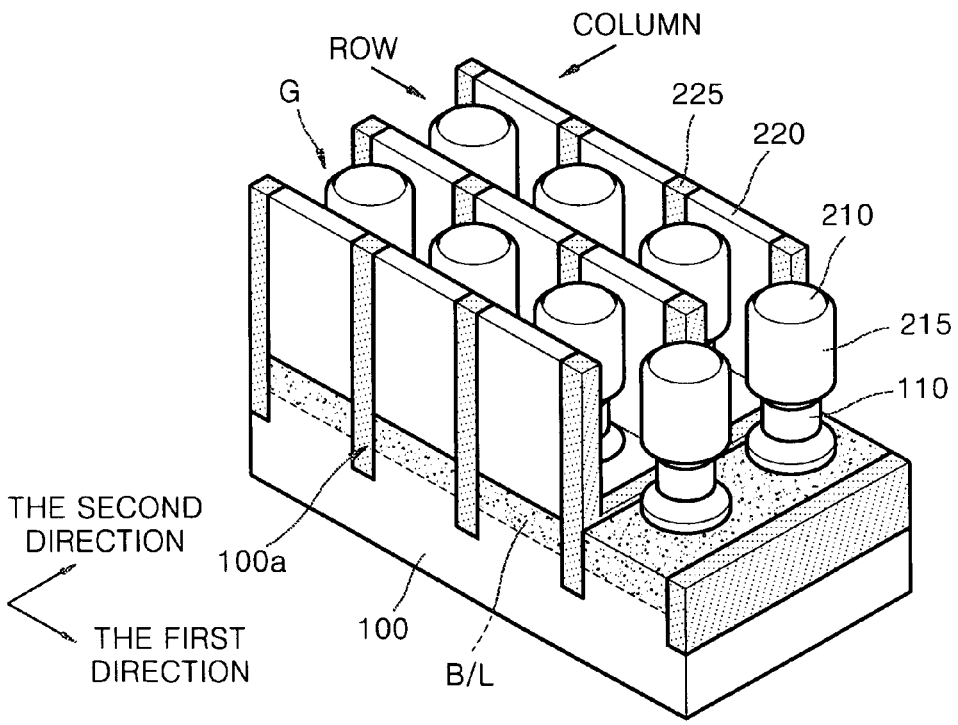
Figure 3E:
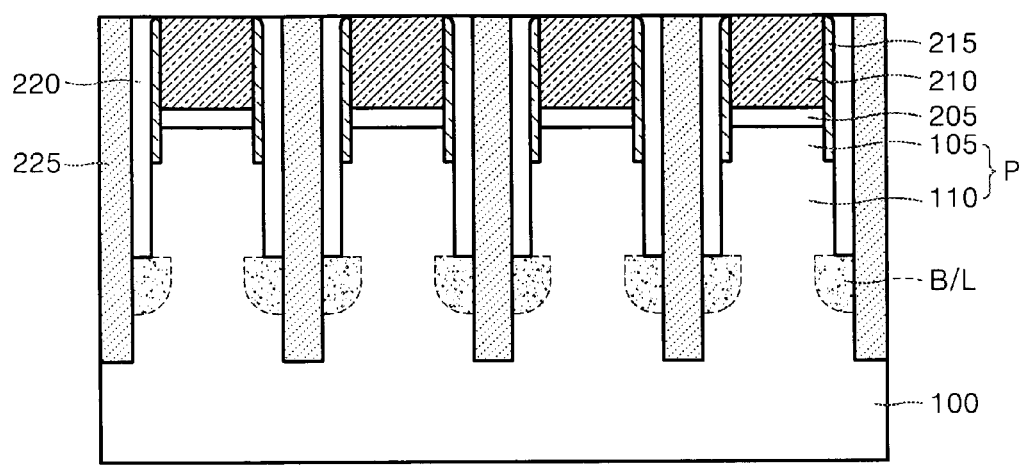
Figure 3F:
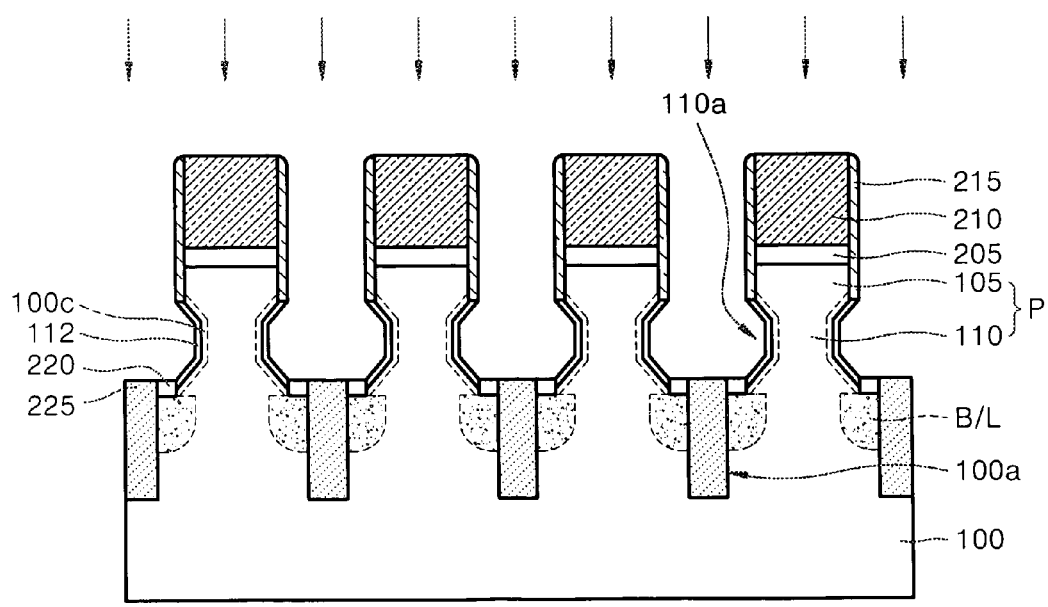
Figure 3G:
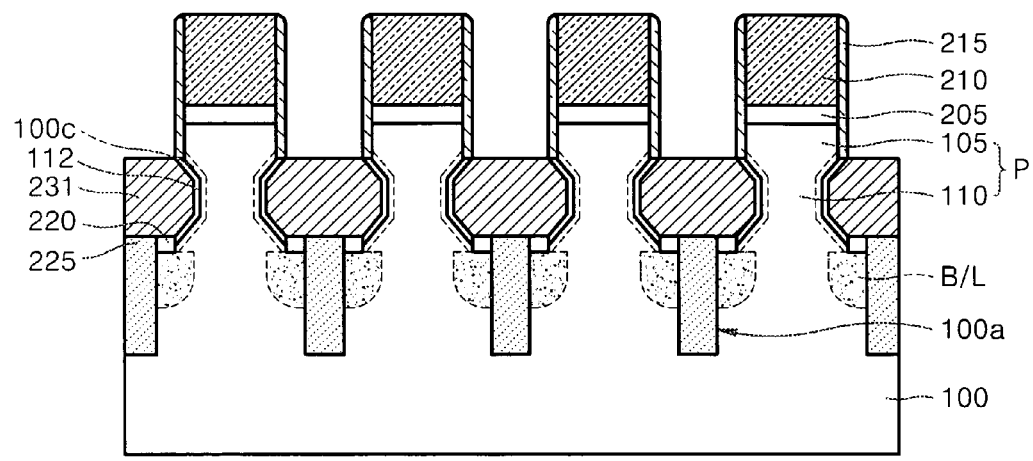
Figure 4E:
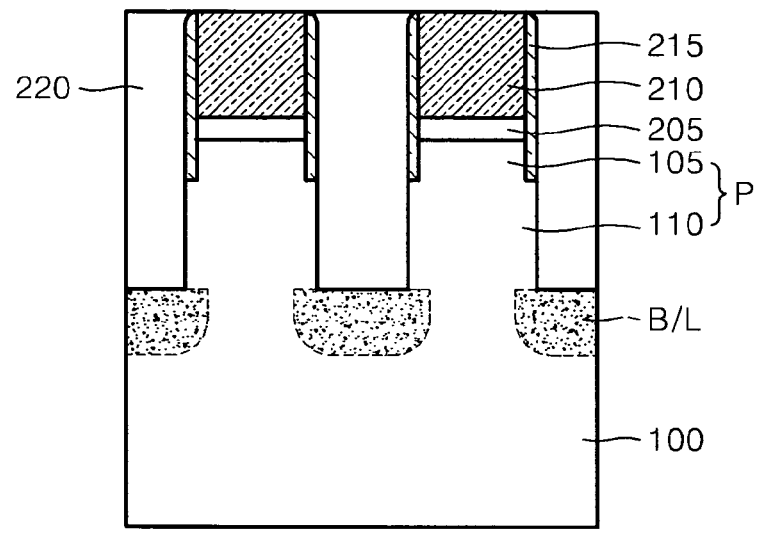

Referring now to FIGS. 2E, 3E, and 4E, buried insulating films 225 that bury the device isolation trenches 100a are formed on the regions of the substrate 100 in which the device isolation trenches 100a are formed. The device isolation trenches 100a buried by the buried insulating films 225 may be referred to herein as device isolation units 100a. The buried insulating films 225 may be planarized until the hard mask pattern 210 is exposed.

Figure 4F:
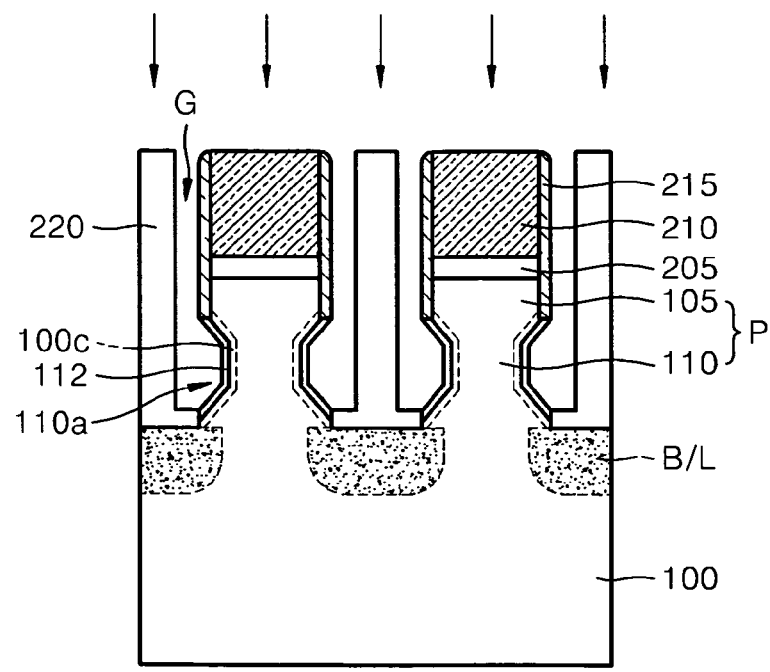
Figure 4G:
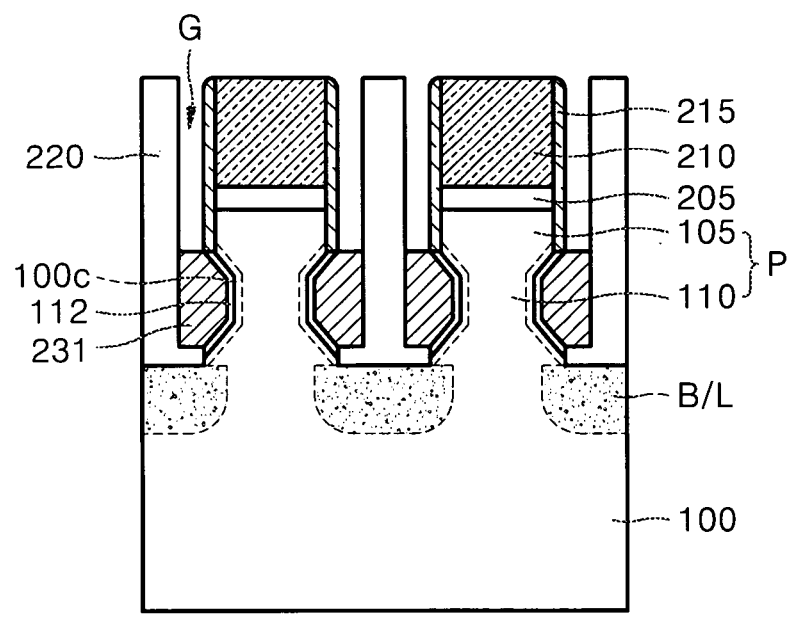

Referring to FIGS. 1D, 2F, 3F, and 4F, a photoresist pattern may be formed on the first interlayer insulating film 220 and the buried insulating films 225. The first interlayer insulating film 220 and the buried insulating films 225 may be etched using the photoresist pattern as a mask. As a result, grooves G that extend in the first direction and expose each of the rows of the active pillars P may be formed in the first interlayer insulating film 220 and the buried insulating films 225. On the bottom of the groove G, the insulating films covering the buried bit lines B/L may remain as seen in FIG. 4F. The active pillars P, including the channel parts 110, are shown as exposed in the grooves G.

Sidewalls of the exposed channel parts 110 may be etched to a predetermined width using the hard mask patterns 210 and the spacers 215 as masks. As a result, the channel parts 110 seen in FIG. 4F are recessed by a predetermined amount toward the center of the channel parts 110, and spaces 110a (FIGS. 3F, 4F) are formed between the substrate 100 and the source parts 105. As a result, the width of the channel part 110 can be reduced. The sidewalls of the channel parts 110 may be etched, for example, using an isotropic etching method.

A gate insulating film 112 is shown formed on a surface of the recessed channel part 110. The gate insulating film 112 may be a thermal oxide film formed using a thermal oxidation method, but is not limited thereto. For example, it may be a deposited oxide film. The gate insulating film 112 can be, for example, a silicon oxide ($SiO_2$) film, a hafnium oxide ($HfO_2$) film, a tantalum oxide ($Ta_2O_5$) film, and/or an oxide/nitride/oxide (ONO) film.

Channel dopant regions 110c may be formed by doping a channel dopant in the channel parts 110 exposed in the grooves G. The channel dopant can be a second type dopant having a conductivity type opposite to the first type dopant. More specifically, the channel dopant can be a p-type dopant, for example, boron (B), where the first type dopant is an n-type dopant. The channel dopant regions 110c can operate to limit or even prevent a short channel effect of the transistor.

As described for some embodiments above, after physically defining the channel parts 110, the channel dopant regions 110c are formed in the channel parts 110. Therefore, the channel dopant regions 110c can be self-aligned to the channel parts 110. Furthermore, the channel parts 110 are aligned with the bit lines B/L, which are drain regions, and the source parts 105. Accordingly, the channel dopant regions 110c can be aligned to the drain regions and the source parts 105.

Furthermore, as described for some embodiments above, after forming the active pillars P, the bit lines B/L, which are drain regions, are formed. Therefore, the drain regions and the active pillars P can be self-aligned. As a result, the overlapping of the drain regions with the channel dopant regions 110c can be minimized.

Also, since the channel dopant regions 110c are formed in the channel parts 110 after physically defining the channel parts 110 in some embodiments, the channel dopant regions 110c can be located on surfaces of the channel parts 110. That is, the dopant concentration in the channel dopant regions 110c is highest at the surface of the channel parts 110, and the dopant concentration is gradually reduced toward the center of the channel parts 110 from the highest point of dopant concentration. As a result, the short channel effect may be limited or even prevented at the surface where the channel dopant regions 110c are formed, while, in the central area of the channel parts 110, where the channel dopant regions 110c are not formed, the formation of the channel is promoted, and accordingly, a channel current can be increased.

The channel dopant regions 110c can also be formed using a plasma doping method in some embodiments. As a result, the channel dopant regions 110c can be formed having a substantially uniform dopant concentration and a shallow junction depth in the entire surface of the channel parts 110.

Referring to FIGS. 1E, 2G, 3G, and 4G, a gate conductive film is stacked on the substrate 100 where the channel dopant regions 110c are formed. The gate conductive film can be buried in the grooves G. The gate conductive film can be, for example, a poly silicon film and/or a silicon germanium film doped with an n-type or a p-type dopant.

Figure 2G:
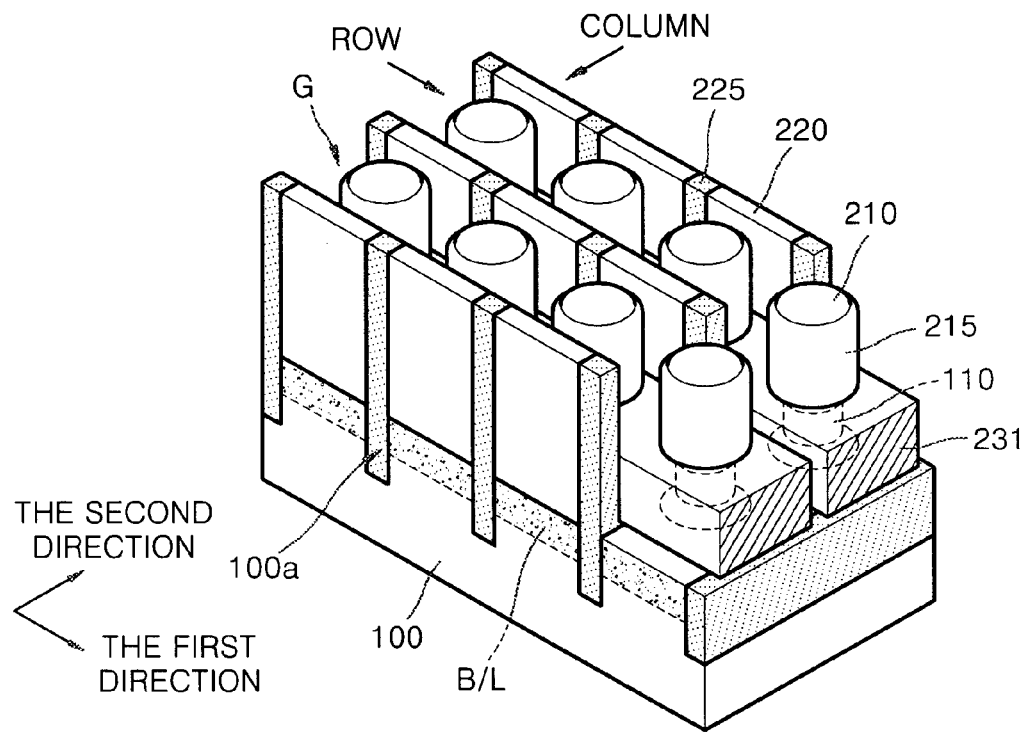

The gate conductive film may be etched back to form gate electrodes 231 in the grooves G. More specifically, the gate electrode 231 may be formed to surround the outer surface of the channel part 110 and extend along the row of the active pillars P to surround the channel parts 110 of the active pillars P located in the row as best seen in FIG. 2G. As a result, the gate electrodes 231 can be self-aligned to the channel dopant regions 110c, which are formed to be self-aligned to the channel parts 110.

Also, each gate electrode 231 may only serve as a gate electrode of one transistor but also may serve as a word line. In this way, because the gate electrode and the word line may be formed simultaneously, contact resistance that can be generated between the gate electrodes and the word line when the word line connected to the gate electrodes is formed after the gate electrodes are formed can be reduced or removed.

When the channel part 110 is recessed by a predetermined amount toward its center and an operating voltage is applied to the gate electrode 231 that surrounds the channel part 110 having a reduced width, the channel part 110 may be fully depleted. As a result, the current, that is, the channel current that flows through the channel part 110, can be increased in some embodiments.

Figure 2H:
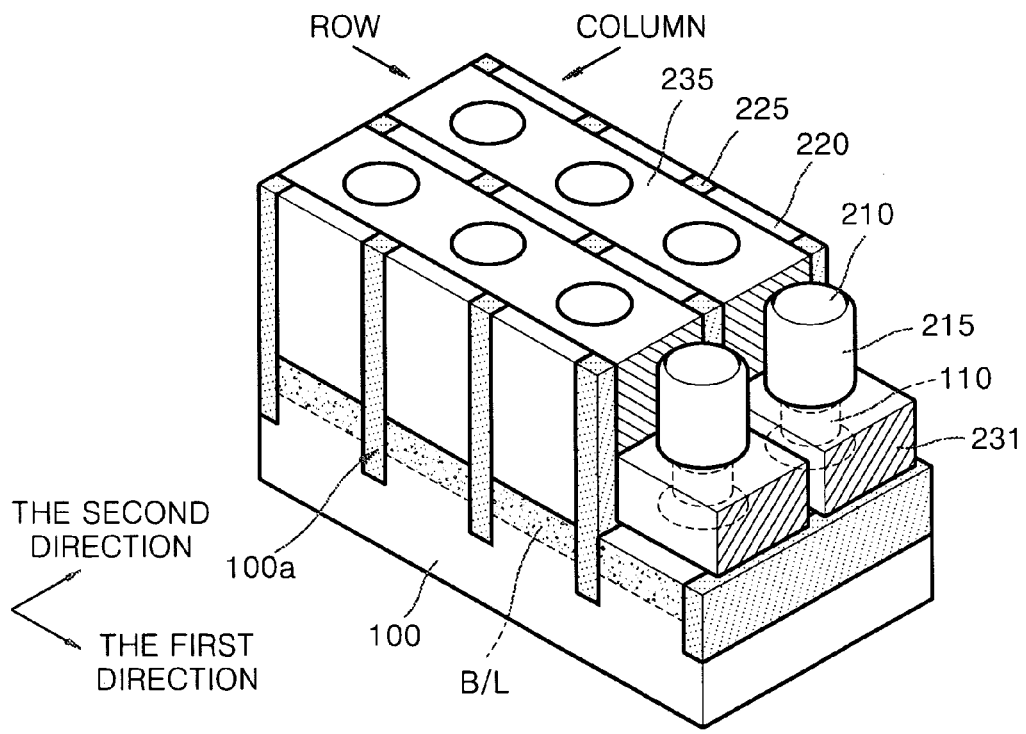
Figure 2I:
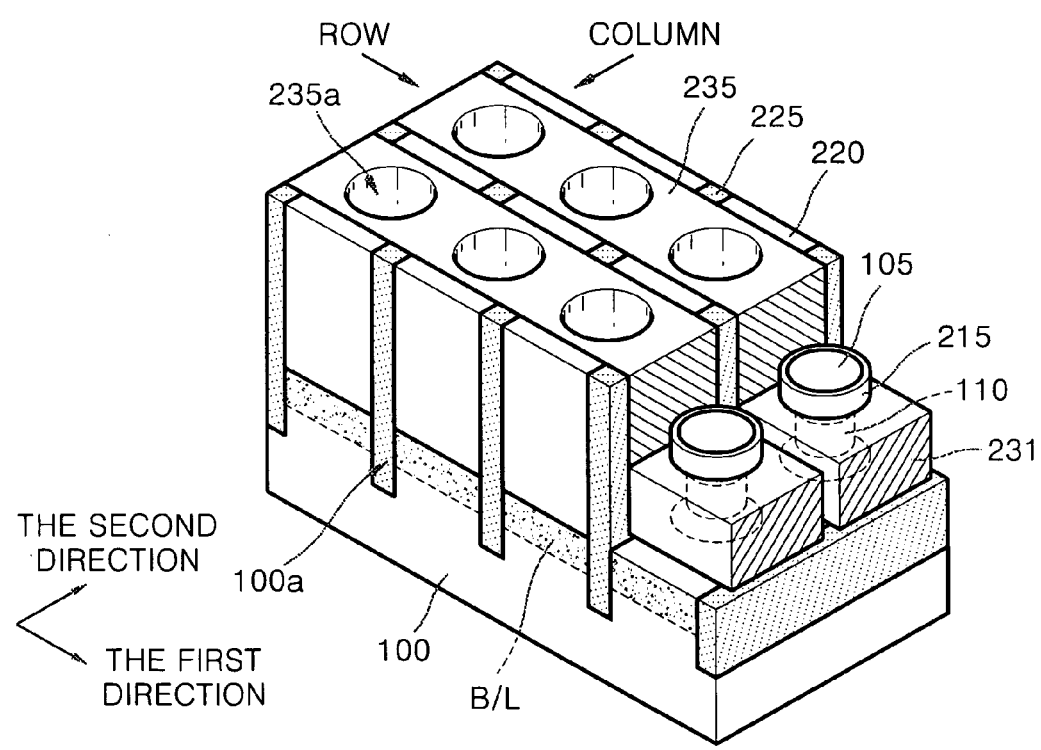
Figure 3H:
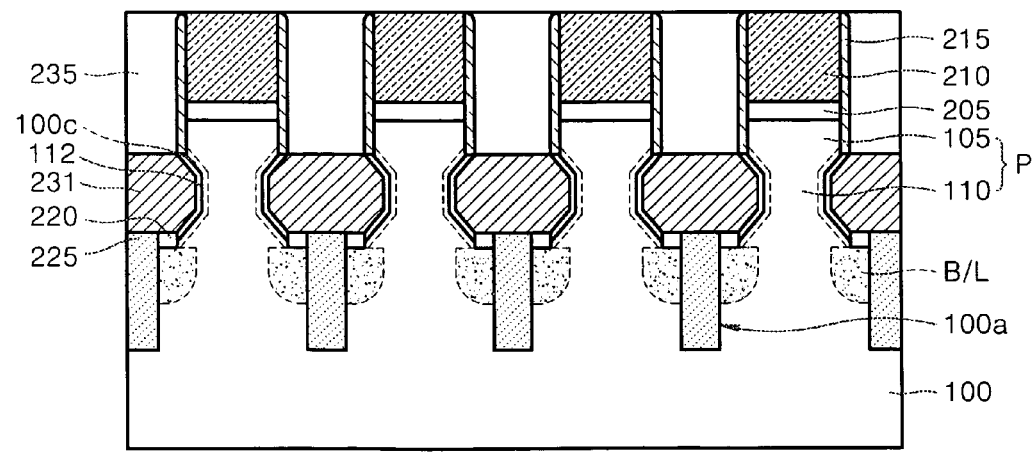
Figure 3I:
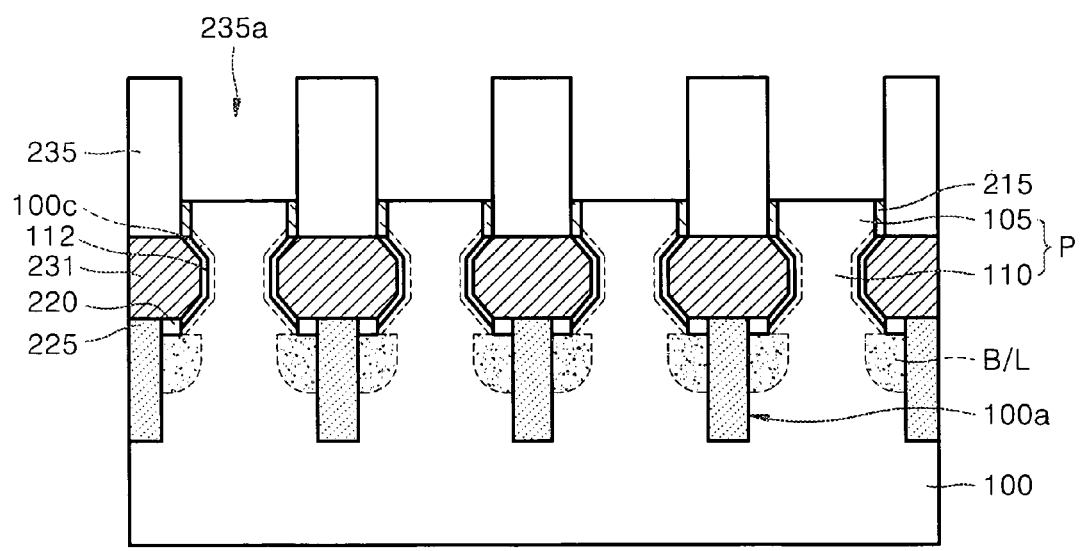
Figure 4H:
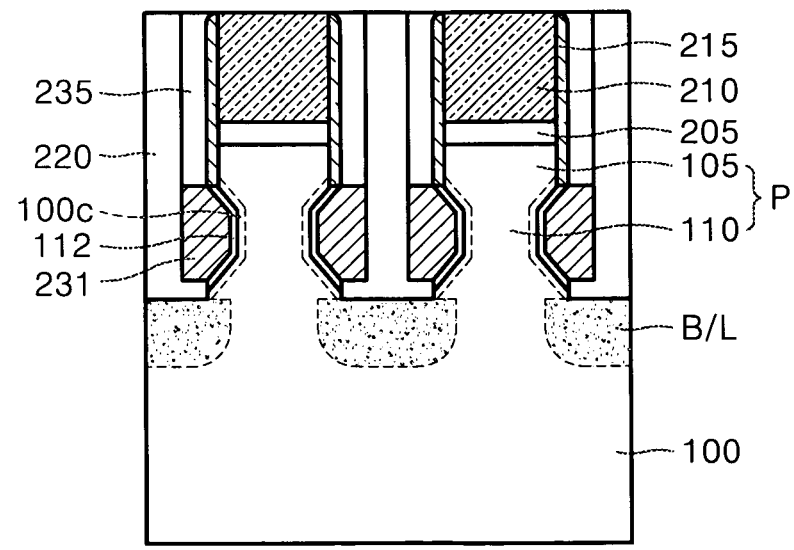
Figure 4I:
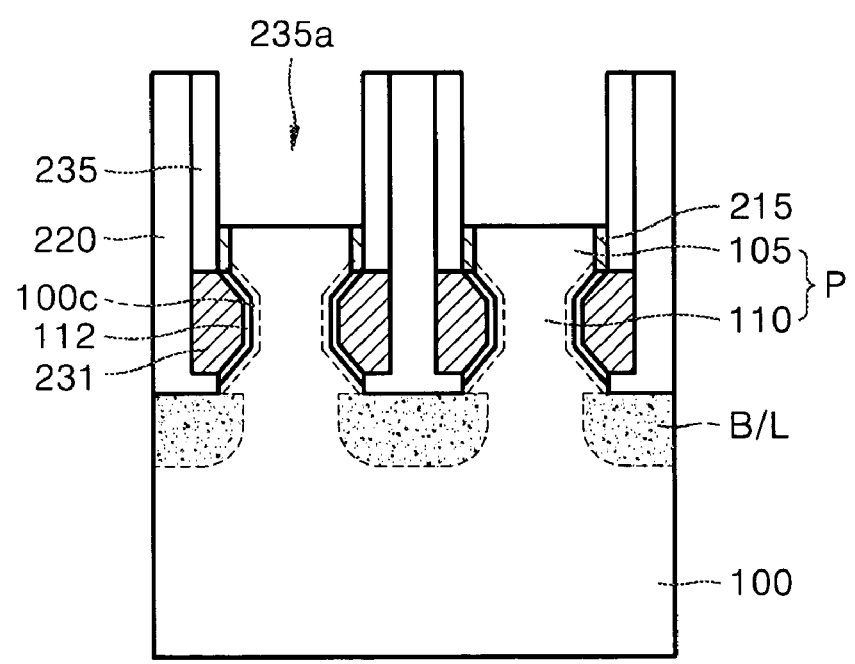

Referring to FIGS. 2H, 3H, and 4H, a second interlayer insulating film 235 that fills the grooves G is shown formed on the substrate 100 on which the gate electrodes 231 are formed. The second interlayer insulating film 235 may be planarized until the hard mask patterns 210 are exposed as shown in FIGS. 2H, 3H, and 4H.

Referring now to FIGS. 1F, 2I, 3I, and 4I, the source parts 105 may be exposed by removing the exposed hard mask patterns 210 and the pad oxide film 205 disposed under the hard mask patterns 210. Using this process, a portion of the spacers 215, that is, the portion of the spacers 215 formed on the sidewalls of the hard mask patterns 210 and the pad oxide film 205 can also be removed. As a result, contact holes 235a that expose the source parts 105 may be formed in the second interlayer insulating film 235.

An insulating spacer can be formed on sidewalls of the contact holes 235a, for example, by stacking an insulating spacer film in the contact holes 235a and etching-back the insulating spacer film to expose surfaces of the source parts 105. The insulating spacer film can be formed of a material having an etch selectivity to the second interlayer insulating film 235 and the source parts 105, such as silicon nitride and/or silicon oxynitride.

Figure 2J:
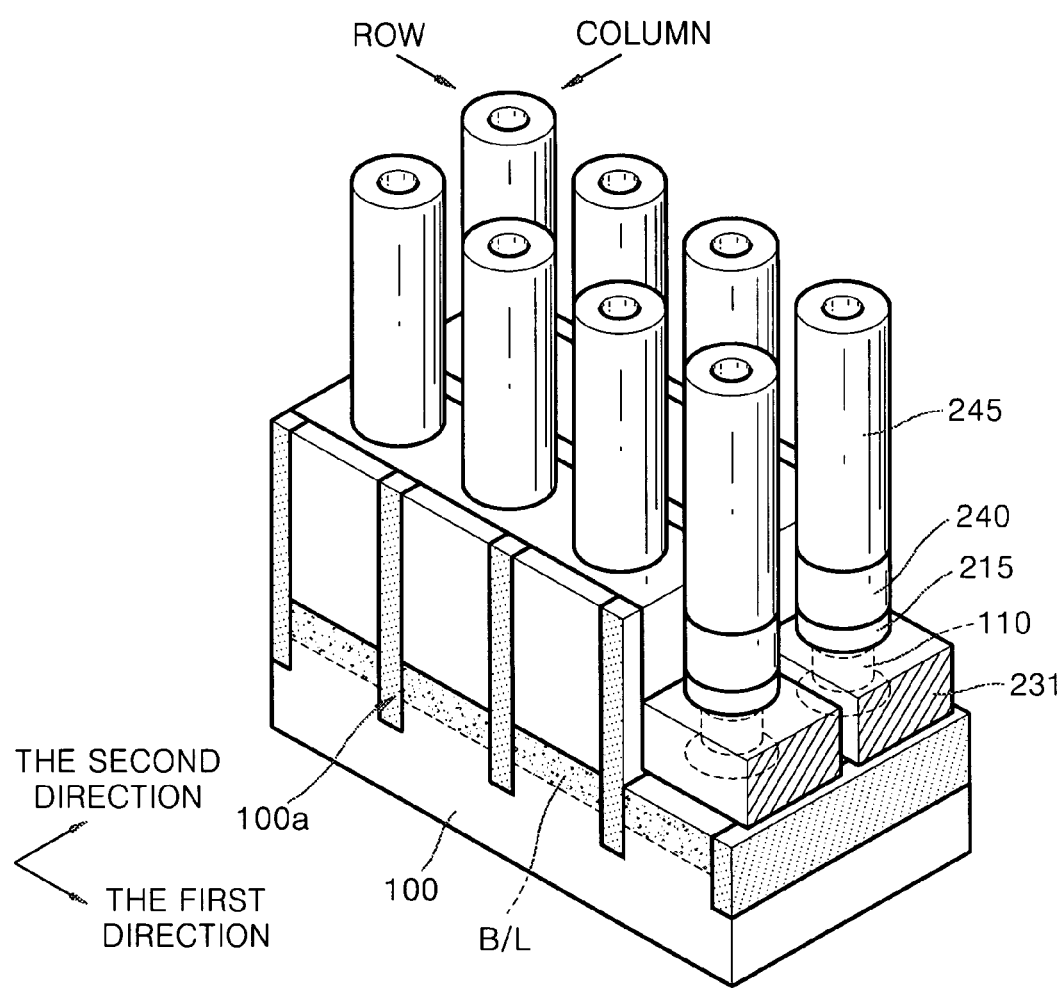
Figure 3J:
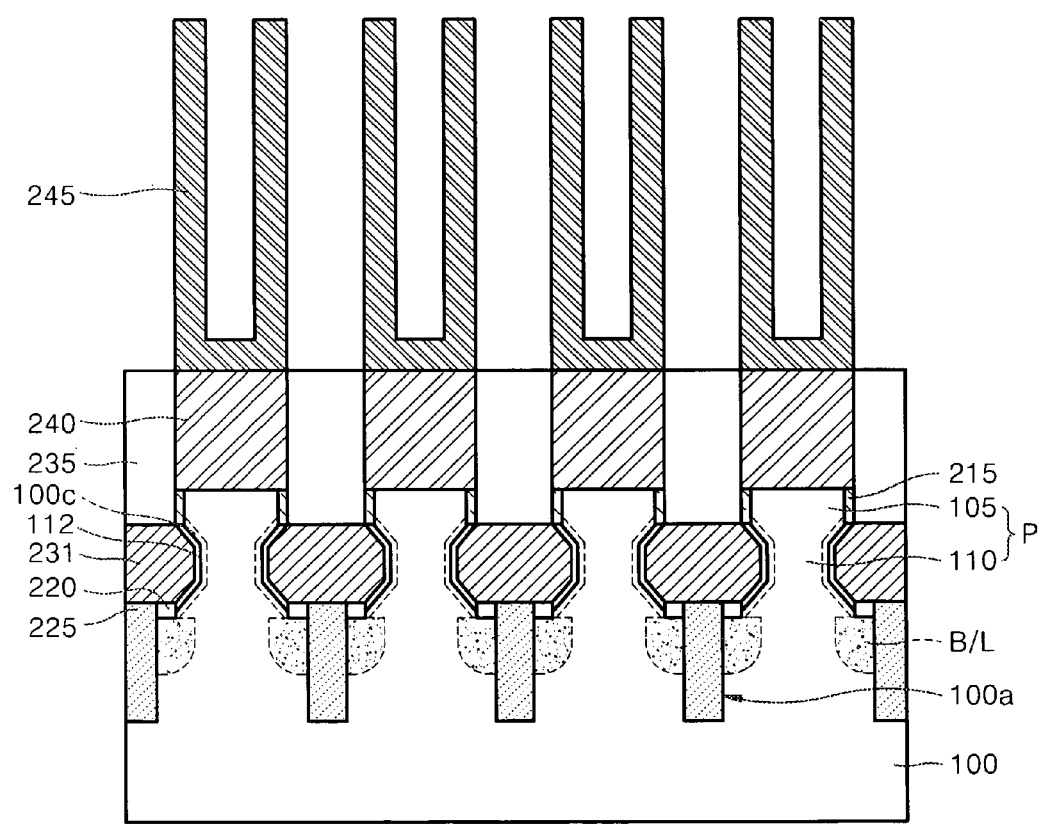
Figure 4J:
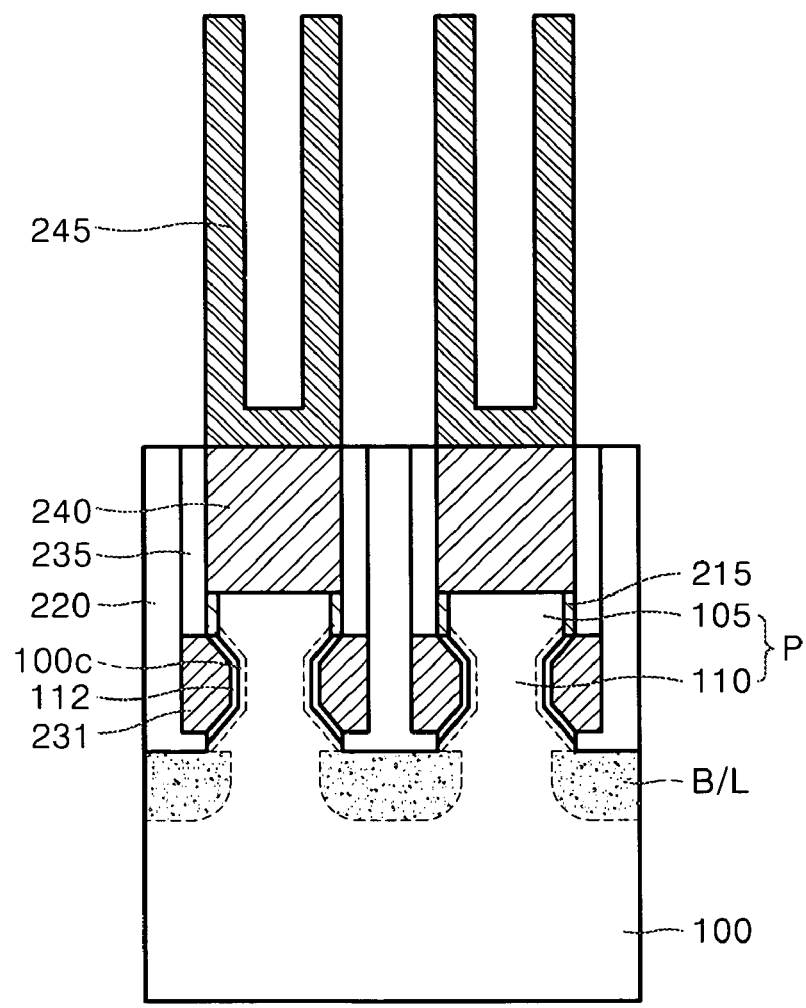

Referring to FIGS. 2J, 3J, and 4J, source regions may be formed by doping a source dopant in the exposed source parts 105. The source dopant can be the first dopant. More specifically, the source dopant can be an n type dopant in some embodiments, for example, P and/or As.

A pad conductive film is deposited to completely fill the contact holes 235a. Contact pads 240 connected to the source parts 105 are formed in the contact holes 235a, for example, by planarizing the pad conductive film until a surface of the second interlayer insulating film 235 is exposed. The pad conductive film can be, for example, a polysilicon film that includes an n type dopant.

Storage electrodes 245 may be formed on the substrate 100 where the contact pads 240 are formed. The storage electrodes 245 are shown connected to the contact pads 240. The storage electrodes 245 can be formed, for example, of a material doped with an n-type dopant, such as polysilicon, titanium, nickel, titanium nitride and/or ruthenium. However, the contact pads 240 can be omitted in other embodiments of the present invention, and in this case, the storage electrodes 245 can be, for example, directly connected to the source parts 105.

A dielectric film (not shown) may stacked on a surface of the storage electrodes 245, and plate electrodes (not shown) that surround the storage electrodes 245 may be formed on the dielectric film.

A semiconductor device according to some embodiments of the present invention will now be described with reference to FIGS. 1F, 2J, 3J, and 4J.

The device includes a substrate 100. Active pillars P are arranged on the substrate 100 extending in rows in a first direction (X-X direction) and columns in a second direction (Y-Y direction) crossing the first direction. The active pillars P may be formed of the same material as the substrate 100. Each of the active pillars P includes a channel part 110. The active pillars P may further include a source part 105 disposed on the channel part 110.

The channel part 110 includes a channel dopant region 110c disposed in a surface of the channel part 110. The concentration of the dopant in the channel dopant region 110c may be highest at the surface of the channel part 110, and gradually reduce toward the center of the channel part 110. Accordingly, the short channel effect can be limited or even prevented at the surface where the channel dopant region 110c is formed, while the formation of channel may be promoted in the central area of the channel part 110 where the channel dopant region 110c is not formed, which may increase the channel current. The channel dopant region 110c may be formed using, for example, a plasma doping method. Also, the channel part 110 can be recessed by a predetermined amount toward its center. That is, the width of the channel part 110 can be reduced.

Buried bit lines B/L are formed in the substrate 100. Each of the buried bit lines B/L may surround each of the active pillars P and extend along each of the columns of the active pillars P. More specifically, the buried bit lines B/L may be dopant regions in the substrate 100 between the active pillars P, and may be defined and separated by device isolation trenches 100a respectively formed between the columns of the active pillars P.

A gate electrode 231 that surrounds the channel part 110 is on an outer surface of the channel part 110. When the channel part 110 has a narrow width as a result of recessing and an operating voltage is applied to the gate electrode 231, the channel part 110 may be fully depleted. As a result, more current may flow through the channel part 110.

The illustrated gate electrode 231 extends along each of the rows of the active pillars P and surrounds the channel parts 110 of the active pillars P that are disposed in the rows of the active pillars P. More specifically, insulating films 220 and 225 having grooves G (see FIG. 2G) that expose each of the rows of the active pillars P on the substrate 100 and the gate electrode 231 can be disposed in the grooves G.

Storage electrodes 245 connected to the source parts 105 are shown disposed on the source parts 105. Furthermore, contact pads 240 may be disposed between the source part 105 and the storage electrode 245. In this case, the storage electrodes 245 and the source parts 105 may be connected through the contact pads 240. However, the active pillars P may not include the source parts 105 and a source region may be formed on a portion of the channel part 110 to serve as the source part 105. However, in some embodiments, a more stable device operation may be realized by including the source part 105.

Plate electrodes that surround the storage electrodes 245 can be provided on the storage electrodes 245. Also, a dielectric film can be interposed between the storage electrodes 245 and the plate electrodes.

According to some embodiments of the present invention, there is provided a method of manufacturing a semiconductor device comprising: forming active pillars arranged in rows in a first direction and a columns in a second direction crossing the first direction on a substrate, wherein each of the active pillars comprises a channel part; forming channel dopant regions in the channel parts; and forming gate electrodes that surround the channel parts on an outer surfaces of the channel parts where the channel dopant regions are formed. In this way, after the channel parts are physically defined, the channel dopant regions can be self-aligned to the channel parts by forming the channel dopant regions.

The method may further comprise isotropic etching the channel parts before forming the channel dopant regions. The channel parts may be formed using a plasma doping method. The method may further comprise, before forming the channel dopant regions, doping the substrate exposed between the active pillars with a bit line dopant; and forming device isolation trenches in the substrate doped with the bit line dopant and exposed between the columns of the active pillars to define buried bit lines that extend along the respective columns of the active pillars. In this way, the overlapping of the bit lines, that is, drain region and the channel dopant regions may be reduce or minimized.

The gate electrodes may extend along the respective rows of the active pillars to surround channel parts disposed in the row of the active pillars. The gate electrode may serve as a word line. As a result, contact resistance that can be generated between the gate electrode and the word line when the word line is separately formed from the gate electrode may be reduced or removed.

The method may further comprise forming source regions by doping a source dopant in the source parts after the gate electrode is formed, wherein each of the active pillars may further comprise source parts disposed on the channel parts. In this way, the overlapping of the bit lines, that is, drain region and the channel dopant regions can be reduced or minimized.

According to some embodiments of the present invention, there is provided a semiconductor device comprising: a substrate; a plurality of active pillars arranged in rows in a first direction and columns in a second direction crossing the first direction, wherein each of the pillars comprises a channel part, and the channel part comprises channel dopant region disposed in surface of the channel part; and a gate electrode disposed on outer surface of the channel part to surround the channel part. The substrate may comprise buried bit line that surrounds the active pillars and extend along the column of the active pillars. The gate electrode may extend along the row of the active pillars to surround the channel parts disposed in the row of the active pillars. An insulating film having grooves that expose each of the rows of the active pillars may be disposed in the substrate, and the gate electrode may be disposed in the grooves. Each of the active pillars may comprise a source part on the channel part. Storage electrodes connected to the source parts may be disposed on the source parts. Contact pads may be interposed between the source parts and the storage electrodes.

As described above, according to some embodiments of the present invention, to form a vertical channel transistor using an active pillar, a channel dopant region is selectively formed in a channel part after defining the channel part and a gate electrode that surrounds the channel part is also formed after physically defining the channel part. Therefore, the channel dopant region can be self-aligned to the channel part and also the gate electrode can be self-aligned to the channel dopant region, which may improve the performance of the vertical channel transistor.

Also, the overlapping of a bit line dopant region with the channel dopant region can be limited or even minimized in some embodiments by forming the bit line dopant region in the exposed portion of the substrate between the active pillars after the active pillars having the channel parts are formed.

As such, some embodiments of the present invention provide a method of manufacturing a semiconductor device by which not only an aligning error between a gate electrode and a channel dopant region but also an aligning error between the channel dopant region and source and/drain regions can be reduced. Semiconductor devices manufactured by the methods are also provided in some embodiments.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a semiconductor device, comprising:
    forming a matrix of active pillars including a channel part on a substrate, wherein the matrix of active pillars is arranged in rows in a first direction and in columns in a second direction crossing the first direction on the substrate;
    forming an insulating film having grooves extending in the first direction, wherein the grooves respectively expose the rows of the active pillars on the substrate;
    forming channel dopant regions in the channel parts of the active pillars in the grooves; and
    forming gate electrodes on an outer surface of the channel parts that surround the channel dopant regions.

2. The method of claim 1, wherein forming the channel dopant regions is preceded by:
    defining buried bit lines that extend along the respective columns of the active pillars by doping the substrate exposed between the active pillars with a bit line dopant and forming device isolation trenches in the substrate exposed between the columns of the active pillars.

3. The method of claim 1, wherein forming the channel dopant regions is preceded by isotropically etching the channel parts.

4. The method of claim 1, wherein forming the channel dopant regions comprises forming the channel dopant regions using a plasma doping process.

5. The method of claim 1, wherein forming the channel dopant regions is preceded by:
    doping an exposed region of the substrate between the active pillars with a bit line dopant; and
    forming device isolation trenches in the substrate region doped with the bit line dopant to define buried bit lines that extend along the respective columns of the active pillars.

6. The method of claim 1, wherein forming the gate electrodes comprises forming the gate electrodes extending along the respective rows of the active pillars to surround channel parts disposed in the respective rows of the active pillars.

7. The method of claim 6, wherein forming the channel dopant regions is preceded by forming an insulating film having grooves that expose the respective rows of the active pillars on the substrate, wherein the channel dopant regions are selectively formed in the channel parts of the active pillars exposed in the grooves, and wherein forming the gate electrodes comprises forming the gate electrodes by etching back a gate conductive film after burying the gate conductive film in the grooves.

8. The method of claim 7, wherein forming the matrix of active pillars further comprises selectively isotropically etching the channel parts before forming the channel dopant regions.

9. The method of claim 8, wherein forming the channel dopant regions comprises forming the channel dopant regions using a plasma doping process.

10. The method of claim 1,
    wherein forming the gate electrodes comprises forming the gate electrodes by etching back a gate conductive film after burying the gate conductive film in the grooves.

11. The method of claim 1, wherein forming the matrix of active pillars further comprises forming a source part disposed on the channel part of the active pillars and wherein the method further comprises forming source regions by doping a source dopant in the source parts after the gate electrodes are formed.

12. The method of claim 11, further comprising forming storage electrodes connected to the respective source regions.

13. The method of claim 12, wherein forming the storage electrodes is preceded by forming contact pads connected to the respective source parts, wherein the storage electrodes are connected to the respective contact pads.

14. A method of manufacturing a semiconductor device, comprising:
    forming hard mask patterns arranged in a first direction and a second direction crossing the first direction on a substrate;
    forming pillar-shaped source parts arranged in rows in the first direction and columns in the second direction by etching the substrate using the hard mask patterns as masks;
    forming spacers on sidewalls of each of the source parts;
    forming pillar-shaped channel parts extending below each of the source parts by further etching the substrate using the hard mask patterns and the spacers as masks to form active pillars, wherein ones of the active pillars include respective ones of the source parts and the channel parts;
    doping an exposed region of the substrate between the active pillars with a bit line dopant;
    forming device isolation trenches in the substrate proximate the region doped with the bit line dopant to define buried bit lines that extend along the respective columns of the active pillars;
    forming an insulating film having grooves extending in the first direction, wherein the grooves respectively expose the rows of the active pillars on the substrate;
    selectively forming channel dopant regions in the channel parts of the active pillars exposed in the grooves; and
    forming gate electrodes on an outer surface of the channel parts that surround the channel dopant regions.

15. The method of claim 14, wherein forming the channel dopant regions is preceded by selectively isotropically etching the channel parts.

16. The method of claim 14, wherein forming the channel dopant regions comprises forming the channel dopant regions using a plasma doping process.

17. The method of claim 14, wherein forming the gate electrodes comprises forming the gate electrodes extending along the respective rows of the active pillars to surround channel parts disposed in the row of the active pillars.

18. The method of claim 17,
wherein forming the gate electrodes comprises forming the gate electrodes by etching back a gate conductive film after burying the gate conductive film in the grooves.

19. The method of claim 18, wherein forming the channel dopant regions is preceded by selectively isotropically etching the channel parts.

20. The method of claim 17, wherein forming the channel dopant regions comprises forming the channel dopant regions using a plasma doping process.

21. The method of claim 14, forming the gate electrodes is followed by forming source regions by doping a source dopant in the source parts.

22. The method of claim 21, further comprising forming storage electrodes connected to the respective source regions.

23. The method of claim 22, wherein forming the storage electrodes is preceded by forming contact pads connected to the respective source parts, wherein the storage electrodes are connected to the respective contact pads.

* * * * *